United States Patent
Jang et al.

(10) Patent No.: US 10,529,437 B2
(45) Date of Patent: Jan. 7, 2020

(54) SEMICONDUCTOR APPARATUS AND SYSTEM RELATING TO PERFORMING A HIGH SPEED TEST IN A LOW SPEED OPERATION ENVIRONMENT

(71) Applicant: SK hynix Inc., Icheon-si, Gyeonggi-do (KR)

(72) Inventors: Soo Young Jang, Seoul (KR); Jin Youp Cha, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/039,112

(22) Filed: Jul. 18, 2018

(65) Prior Publication Data
US 2019/0198131 A1    Jun. 27, 2019

(30) Foreign Application Priority Data

Dec. 21, 2017   (KR) .......................... 10-2017-0176622

(51) Int. Cl.
| | |
|---|---|
| *G11C 29/12* | (2006.01) |
| *G11C 11/34* | (2006.01) |
| *G11C 29/18* | (2006.01) |
| *G11C 29/56* | (2006.01) |
| *G01R 31/26* | (2014.01) |
| *G11C 29/44* | (2006.01) |

(52) U.S. Cl.
CPC .... *G11C 29/12015* (2013.01); *G01R 31/2642* (2013.01); *G11C 11/34* (2013.01); *G11C 29/18* (2013.01); *G11C 29/56012* (2013.01); *G11C 2029/4402* (2013.01); *G11C 2029/5602* (2013.01)

(58) Field of Classification Search
USPC ............................................ 365/201, 230.03
See application file for complete search history.

(56) References Cited

U.S. PATENT DOCUMENTS

| | | | |
|---|---|---|---|
| 6,275,550 B1 * | 8/2001 | Fukuda ................ | H04L 7/0331 327/161 |
| 7,613,125 B2 | 11/2009 | Fidler et al. | |
| 7,821,919 B2 * | 10/2010 | Mizutani ............ | G06F 11/1443 370/216 |
| 7,831,223 B2 | 11/2010 | Kawashima | |
| 9,906,358 B1 * | 2/2018 | Tajalli .................. | H03L 7/0807 |
| 2002/0131190 A1 * | 9/2002 | Groo .................. | G11B 20/1403 360/51 |

(Continued)

*Primary Examiner* — Michael T Tran
(74) *Attorney, Agent, or Firm* — William Park & Associates Ltd.

(57) ABSTRACT

A system may include a first semiconductor apparatus and a second semiconductor apparatus. Each of the first and second semiconductor apparatuses may receive reference data and a first clock signal. The first semiconductor apparatus may generate a first internal clock signal from the first clock signal, and may output the reference data as transmission data based on the first internal clock signal. The second semiconductor apparatus may generate a second internal clock signal from the first clock signal, and may receive the transmission data based on the second internal clock signal. The second semiconductor apparatus may generate an error detection signal based on the received data and the reference data.

27 Claims, 6 Drawing Sheets

(56) References Cited

U.S. PATENT DOCUMENTS

| | | | | |
|---|---|---|---|---|
| 2003/0043926 A1* | 3/2003 | Terashima | H04L 7/0012 | 375/257 |
| 2003/0145259 A1* | 7/2003 | Kashiwakura | H04L 43/50 | 714/712 |
| 2005/0089066 A1* | 4/2005 | Soga | H04N 11/042 | 370/498 |
| 2005/0111572 A1* | 5/2005 | Kuroda | H04L 7/0008 | 375/295 |
| 2007/0046819 A1* | 3/2007 | Sasakura | H04N 7/01 | 348/571 |
| 2007/0217559 A1* | 9/2007 | Stott | G11C 7/1051 | 375/355 |
| 2008/0054959 A1* | 3/2008 | Fujisawa | H03L 7/0812 | 327/149 |
| 2008/0130811 A1* | 6/2008 | Bae | G11O 5/063 | 375/355 |
| 2009/0167384 A1* | 7/2009 | Sohn | G06G 7/16 | 327/156 |
| 2009/0267684 A1* | 10/2009 | Do | G05F 1/465 | 327/540 |
| 2010/0052739 A1* | 3/2010 | Shibata | G11C 7/1072 | 327/117 |
| 2010/0054059 A1* | 3/2010 | Yoon | G11C 7/1072 | 365/194 |
| 2010/0097111 A1* | 4/2010 | Hyun | H03L 7/0814 | 327/158 |
| 2010/0213991 A1* | 8/2010 | Fukuda | H03L 7/0814 | 327/117 |
| 2010/0244913 A1* | 9/2010 | Golding | G06F 1/12 | 327/156 |
| 2011/0025279 A1* | 2/2011 | Jinbo | G11C 5/145 | 323/234 |
| 2011/0051779 A1* | 3/2011 | Wu | H03K 3/84 | 375/130 |
| 2011/0141354 A1* | 6/2011 | Katou | G09G 5/003 | 348/500 |
| 2011/0215875 A1* | 9/2011 | Yagishita | H03L 7/00 | 331/34 |
| 2011/0267117 A1* | 11/2011 | Choi | H03L 7/00 | 327/156 |
| 2012/0092051 A1* | 4/2012 | Erdogan | H03L 7/0812 | 327/158 |
| 2012/0192043 A1* | 7/2012 | Jiang | G01R 31/31716 | 714/799 |
| 2012/0263193 A1* | 10/2012 | Kamada | H04J 3/0632 | 370/503 |
| 2012/0331327 A1* | 12/2012 | Gaskins | G06F 1/12 | 713/401 |
| 2013/0051140 A1* | 2/2013 | Hendrickson | G11C 7/222 | 365/185.01 |
| 2013/0067296 A1* | 3/2013 | Takahashi | H03M 13/05 | 714/776 |
| 2013/0216014 A1* | 8/2013 | Kong | H03L 7/07 | 375/376 |
| 2013/0257599 A1* | 10/2013 | Tseng | G06K 19/073 | 340/10.5 |
| 2013/0293271 A1* | 11/2013 | Song | H03K 21/00 | 327/115 |
| 2013/0322462 A1* | 12/2013 | Poulsen | H04J 3/06 | 370/458 |
| 2014/0111257 A1* | 4/2014 | Ying | H03K 3/013 | 327/117 |
| 2014/0292385 A1* | 10/2014 | Bahl | H03K 3/012 | 327/144 |
| 2014/0340968 A1* | 11/2014 | Kim | G11C 7/22 | 365/189.02 |
| 2015/0009774 A1* | 1/2015 | Ko | G11C 8/06 | 365/230.08 |
| 2015/0055803 A1* | 2/2015 | Qutub | H04R 3/00 | 381/111 |
| 2015/0098537 A1* | 4/2015 | Sengoku | H04L 7/0087 | 375/355 |
| 2015/0187404 A1* | 7/2015 | Oh | G11C 8/18 | 365/154 |
| 2015/0222282 A1* | 8/2015 | McAdams | H03K 5/00006 | 327/145 |
| 2016/0150473 A1* | 5/2016 | Katayama | H04W 52/0248 | 370/311 |
| 2016/0182058 A1* | 6/2016 | Stirk | H02J 7/0052 | 327/145 |
| 2016/0239936 A1* | 8/2016 | Baek | H04N 5/2258 | |
| 2016/0292111 A1* | 10/2016 | Doo | G06F 13/3625 | |
| 2017/0033955 A1* | 2/2017 | Natarajan | H04L 25/49 | |
| 2017/0117031 A1* | 4/2017 | Lee | G11C 11/4076 | |
| 2018/0081695 A1* | 3/2018 | Kushwaha | G06F 12/0246 | |
| 2018/0121280 A1* | 5/2018 | Sanders | G06F 11/1604 | |
| 2018/0131503 A1* | 5/2018 | Duan | H04L 7/0012 | |
| 2018/0316484 A1* | 11/2018 | Ooishi | H04B 1/16 | |
| 2018/0350411 A1* | 12/2018 | Ware | H01L 39/223 | |
| 2019/0072684 A1* | 3/2019 | Manfredini | G01H 1/00 | |

\* cited by examiner

SEMICONDUCTOR APPARATUS AND SYSTEM RELATING TO PERFORMING A HIGH SPEED TEST IN A LOW SPEED OPERATION ENVIRONMENT

CROSS-REFERENCES TO RELATED APPLICATION

The present application claims priority under 35 U.S.C. § 119(a) to Korean application number 10-2017-0176622, filed on Dec. 21, 2017, in the Korean Intellectual Property Office, which is incorporated herein by reference in its entirety.

BACKGROUND

1. Technical Field

Various embodiments generally relate to an integrated circuit technology, and, more particularly, to a semiconductor apparatus, a system including the semiconductor apparatus and a test method of the semiconductor apparatus.

2. Related Art

Each electronic apparatus may include a large number of electronic components. Among the electronic apparatuses, a computer system may include a large number of semiconductor apparatuses which are constructed by semiconductors. The semiconductor apparatuses which construct the computer system may communicate with one another by transmitting or receiving a clock signal and data. As the demands for operating speeds of the computer system to increase, so does the development needed to provide a semiconductor apparatus having high speed operations. Also, the frequency of a clock signal is increased as a result so that data communication may be performed at a high speed between semiconductor apparatuses. In particular, in graphic semiconductor apparatuses, a data rate of 16 Gbps is being realized by using a clock signal of, for example, 8 GHz or more.

After a semiconductor apparatus is manufactured and packaged on a wafer, it may be tested through test equipment to verify the reliability of the semiconductor apparatus. In comparison with that the operating speed of a semiconductor apparatus increases, the development speed of test equipment is generally slow. Since test equipment is generally expensive, it is difficult to frequently change test equipment in line with an increase in the operating speed of a semiconductor apparatus. Therefore, there is a need for a method capable of performing a high-speed test for a semiconductor apparatus by using test equipment operating at a low speed.

SUMMARY

In an embodiment, a system may be provided. The system may include a first semiconductor apparatus and a second semiconductor apparatus. The first semiconductor apparatus may output reference data as transmission data based on a first internal clock signal generated from a first clock signal. The second semiconductor apparatus may generate reception data by receiving the transmission data based on a second internal clock signal generated from the first clock signal, and may generate an error detection signal based on the reception data and the reference data.

In an embodiment, a system may be provided. The system may include an external apparatus configured to provide a first clock signal and reference data. The system may include a first semiconductor apparatus configured to generate a first internal clock signal from the first clock signal, and may output the reference data as transmission data based on the first internal clock signal. The system may include a second semiconductor apparatus configured to generate a second internal clock signal from the first clock signal, generate reception data by receiving the transmission data based on the second internal clock signal, and generate an error detection signal based on the reference data and the reception data.

In an embodiment, a method for testing a system including an external apparatus, a first semiconductor apparatus, and a second semiconductor apparatus may be provided. The method may include providing reference data to each of the first and second semiconductor apparatuses from the external apparatus. The method may include providing a first clock signal to the first semiconductor apparatus from the external apparatus, and generating a first internal clock signal from the first clock signal in the first semiconductor apparatus. The method may include providing a first clock signal to the second semiconductor apparatus from the external apparatus, and generating a second internal clock signal from the first clock signal in the second semiconductor apparatus. The method may include outputting the reference data to a shared bus based on the first internal clock signal in the first semiconductor apparatus. The method may include receiving the data transmitted through the shared bus, based on the second internal clock signal in the second semiconductor apparatus. The method may include generating an error detection signal based on the received data and the reference data in the second semiconductor apparatus.

In an embodiment, a system may be provided. The system may include a first semiconductor apparatus configured to receive a first clock signal to generate a first internal clock signal allowing data input and output operations of the first semiconductor apparatus to perform with a target frequency corresponding to a frequency which is greater than the first clock signal. The system may include a second semiconductor apparatus coupled to the first semiconductor apparatus through a shared bus and configured to receive the first clock signal to generate a second internal clock signal allowing data input and output operations of the second semiconductor apparatus to perform with the target frequency corresponding to the frequency which is greater than the first clock signal. The first semiconductor apparatus may output transmission data based on the first internal clock signal to the second semiconductor apparatus. The second semiconductor apparatus may receive the transmission data based on the second internal clock signal through the shared bus and may generate an error detection signal based on the transmission data.

DETAILED DESCRIPTION

Hereinafter, a semiconductor apparatus and system related to performing a high speed test in a low speed operation environment will be described below with reference to the accompanying drawings through various examples of embodiments.

Figure 1:
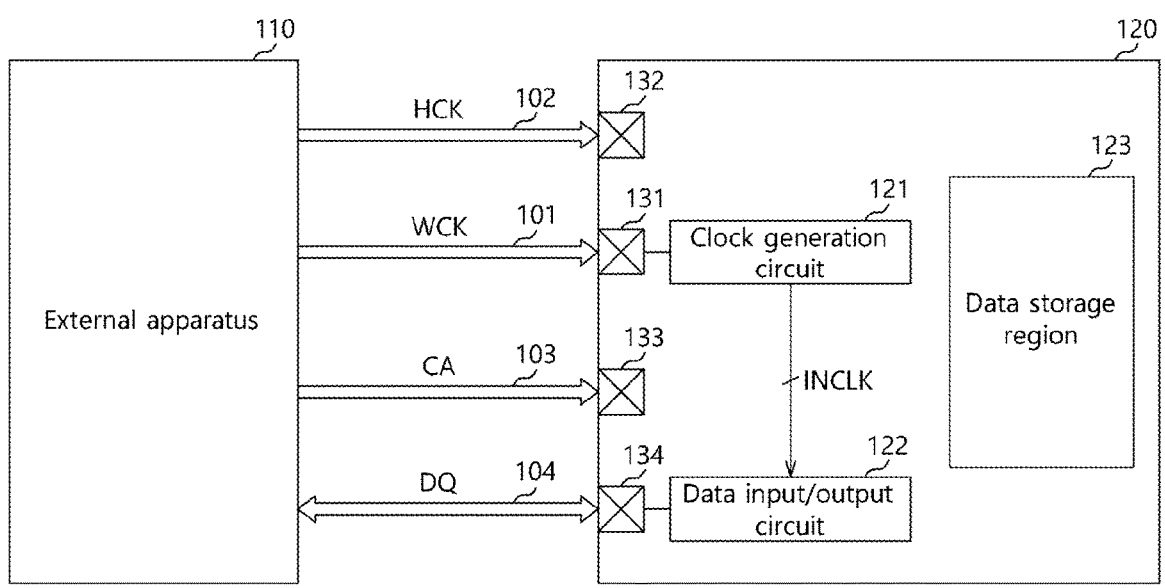
FIG. 1 is a diagram illustrating a representation of an example of the configuration of a system in accordance with an embodiment.

FIG. 1 is a diagram illustrating a representation of an example of the configuration of a system 1 in accordance with an embodiment. Referring to FIG. 1, the system 1 may include an external apparatus 110 and a semiconductor apparatus 120. The external apparatus 110 may provide various control signals necessary for the semiconductor apparatus 120 to operate. The external apparatus 110 may include various kinds of apparatuses. For example, the external apparatus 110 may be a host apparatus such as a central processing unit (CPU), a graphic processing unit (GPU), a multimedia processor (MMP), a digital signal processor, an application processor AP and a memory controller. Also, the external apparatus 110 may be a test apparatus or test equipment for testing the semiconductor apparatus 120. The semiconductor apparatus 120 may be, for example, a memory apparatus, and the memory apparatus may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The semiconductor apparatus 120 may perform a test operation by being coupled with the external apparatus 110 functioning as test equipment. The semiconductor apparatus 120 may perform various operations except the test operation by being coupled with the external apparatus 110 functioning as a host apparatus. For example, after the semiconductor apparatus 120 is manufactured, the semiconductor apparatus 120 may be tested by being coupled with the external apparatus 110 functioning as test equipment. After a test is completed, the semiconductor apparatus 120 may perform various operations by being coupled with the external apparatus 110 functioning as a host apparatus.

The semiconductor apparatus 120 may be coupled with the external apparatus 110 through a plurality of buses. The plurality of buses may be signal transmission paths, links or channels for transmitting signals. The plurality of buses may include a first clock bus 101, a second clock bus 102, a command address bus 103 and a data bus 104. The first clock bus 101, the second clock bus 102 and the command address bus 103 may be unidirectional buses, and the data bus 104 may be a bidirectional bus. The semiconductor apparatus 120 may be coupled with the external apparatus 110 through the first clock bus 101, and may receive a data clock signal WCK through the first clock bus 101. The data clock signal WCK may include one or more pairs of clock signals. The semiconductor apparatus 120 may receive a system clock signal HCK which is transmitted from the external apparatus 110, through the second clock bus 102. The system clock signal HCK may be a pair of clock signals. The semiconductor apparatus 120 may receive a command address signal CA through the command address bus 103. The command address signal CA may include a plurality of bits. The semiconductor apparatus 120 may receive the command address signal CA based on the system clock signal HCK. The semiconductor apparatus 120 may be coupled with the external apparatus 110 through the data bus 104, and may receive data DQ from the external apparatus 110 or transmit data DQ to the external apparatus 110, through the data bus 104.

The semiconductor apparatus 120 may include a clock generation circuit 121, a data input/output circuit 122 and a data storage region 123. The clock generation circuit 121 may be coupled with the first clock bus 101 through a first clock pad 131, and may receive the data clock signal WCK and generate a plurality of internal clock signals INCLK. In an embodiment, the frequency of the data clock signal WCK may be higher than the frequency of the system clock signal HCK. The semiconductor apparatus 120 may receive the data DQ transmitted from the external apparatus 110 or transmit data DQ to the external apparatus 110, in synchronization with the data clock signal WCK. The semiconductor apparatus 120 may receive and/or sample the data DQ transmitted through the data bus 104, with the data clock signal WCK. In order to sufficiently secure a timing margin for receiving and/or sampling the data DQ, the semiconductor apparatus 120 may use the data clock signal WCK through dividing it. The clock generation circuit 121 may divide the data clock signal WCK and generate the plurality of internal clock signals INCLK.

The data input/output circuit 122 may be coupled with the data bus 104 through a data pad 134, and may receive the data DQ transmitted from the external apparatus 110 or transmit data DQ to the external apparatus 110, through the data pad 134. The data input/output circuit 122 may receive the plurality of internal clock signals INCLK generated from the clock generation circuit 121. The data input/output circuit 122 may perform input/output operations for data DQ based on the plurality of internal clock signals INCLK. The data input/output circuit 122 may transmit data DQ to the external apparatus 110 in synchronization with the plurality of internal clock signals INCLK, and may receive the data DQ transmitted from the external apparatus 110 in synchronization with the plurality of internal clock signals INCLK. The semiconductor apparatus 120 may further include a second clock pad 132 and a command address pad 133. The second clock pad 132 may be coupled with the second clock bus 102, and the semiconductor apparatus 120 may receive the system clock signal HCK transmitted from the external apparatus 110, through the second clock pad 132. The command address pad 133 may be coupled with the command address bus 103, and the semiconductor apparatus 120 may receive the command address signal CA transmitted from the external apparatus 110, through the command address pad 133.

The data received from the external apparatus 110 through the data input/output circuit 122 may be stored in the data storage region 123. Data stored in the data storage region 123 may be outputted to the external apparatus 110 through the data input/output circuit 122. The data storage region 123 may be a memory cell array which includes a plurality of memory cells. The data storage region 123 may have a plurality of bit lines (not illustrated) and a plurality of word lines (not illustrated), and may include a plurality of memory cells (not illustrated) which are respectively coupled to points where the plurality of bit lines and the plurality of word lines intersect with each other.

Figure 2:
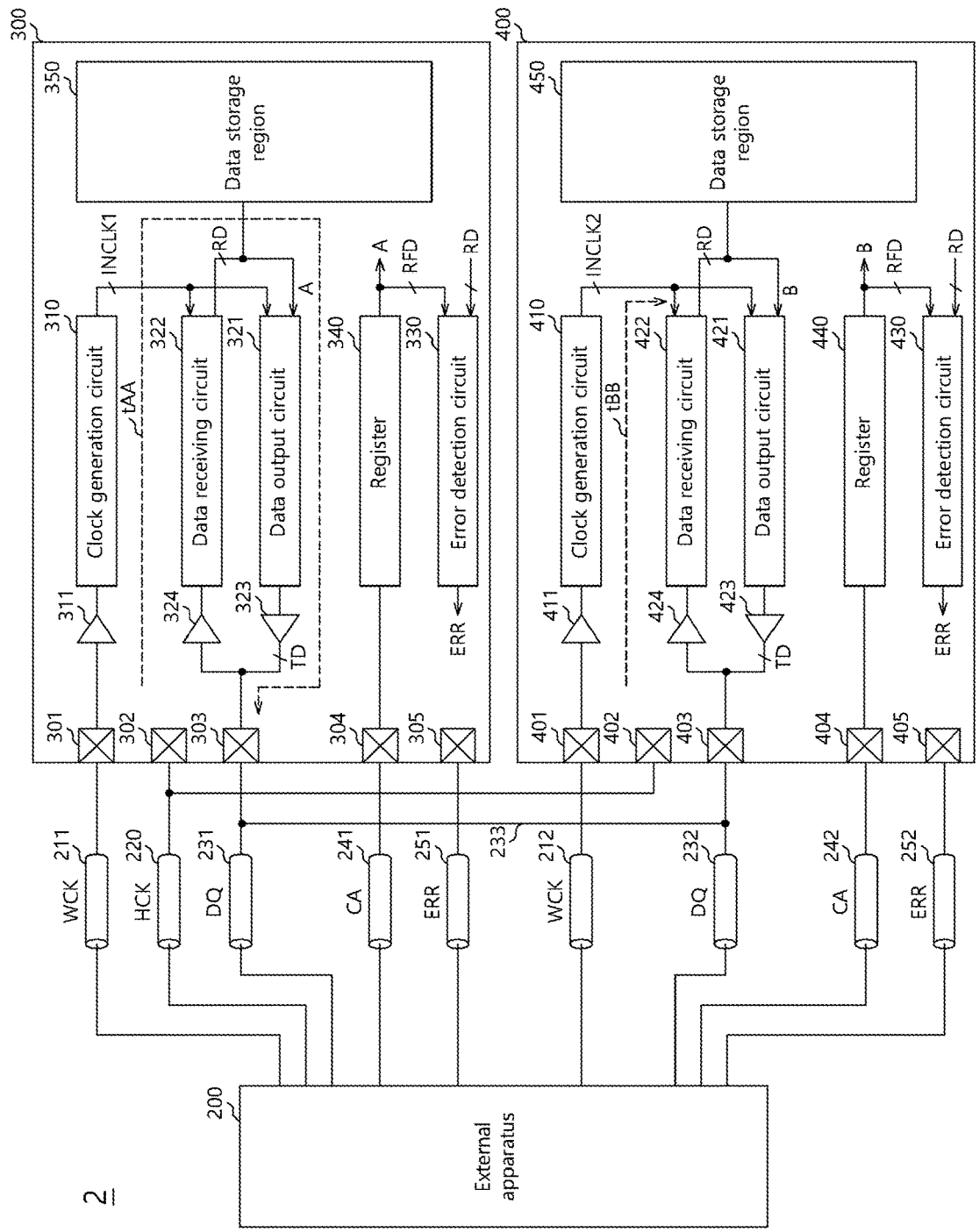
FIG. 2 is a diagram illustrating a representation of an example of the configuration of a system in accordance with an embodiment.

FIG. 2 is a diagram illustrating a representation of an example of the configuration of a system 2 in accordance with an embodiment. Referring to FIG. 2, the system 2 may include an external apparatus 200 and a semiconductor apparatus. The external apparatus 200 may be a component corresponding to the external apparatus 110 illustrated in FIG. 1. The system 2 may include a plurality of semiconductor apparatuses. In FIG. 2, it is illustrated that the system 2 includes two semiconductor apparatuses. The system 2 may include a plurality of channels. The plurality of channels may perform data input/output operations independently of one another. In FIG. 2, the system 2 may include a first semiconductor apparatus 300 and a second semiconductor apparatus 400. Each of the first and second semiconductor apparatuses 300 and 400 may be a component corresponding to the semiconductor apparatus 120 illustrated in FIG. 1. The system 2 may include a first channel and a second channel, the first semiconductor apparatus 300 may perform a data input/output operation as the first channel, and the second semiconductor apparatus 400 may perform a data input/output operation as the second channel. The first and second semiconductor apparatuses 300 and 400 may be respectively coupled with the external apparatus 200 through a plurality of buses. In an embodiment, the first and second semiconductor apparatuses 300 and 400 may be the components of a single packaged semiconductor apparatus.

The external apparatus 200 may be coupled with the first semiconductor apparatus 300 through a first data clock bus 211, a first data bus 231 and a first command address bus 241. The external apparatus 200 may be coupled with the second semiconductor apparatus 400 through a second data clock bus 212, a second data bus 232 and a second command address bus 242. The external apparatus 200 may provide a first clock signal WCK to the first and second semiconductor apparatuses 300 and 400 through the first and second data clock buses 211 and 212, respectively. The first clock signal WCK may be a data clock signal. The external apparatus 200 may provide data DQ to the first and second semiconductor apparatuses 300 and 400 through the first and second data buses 231 and 232. The first and second semiconductor apparatuses 300 and 400 may provide data DQ to the external apparatus 200 through the first and second data buses 231 and 232, respectively. The external apparatus 200 may not transmit data DQ through the first and second data buses 231 and 232 during a test operation. The first and second semiconductor apparatuses 300 and 400 may not receive data from the first and second data buses 231 and 232 during the test operation. The external apparatus 200 may provide a command address signal CA to the first and second semiconductor apparatuses 300 and 400 through the first and second command address buses 241 and 242, respectively. In the alternative of not providing data DQ through the first and second data buses 231 and 232 during the test operation, the external apparatus 200 may provide reference data RFD to the first and second semiconductor apparatuses 300 and 400 through the first and second command address buses 241 and 242. The reference data RFD may be transmitted in the form of the command address signal CA to the first and second semiconductor apparatuses 300 and 400 through the first and second command address buses 241 and 242.

The plurality of buses may further include a system clock bus 220, a first error detection bus 251 and a second error detection bus 252. The external apparatus 200 may be coupled with the first semiconductor apparatus 300 through the system clock bus 220 and the first error detection bus 251, and may be coupled with the second semiconductor apparatus 400 through the system clock bus 220 and the second error detection bus 252. The external apparatus 200 may provide a second clock signal HCK to the first and second semiconductor apparatuses 300 and 400 through the system clock bus 220. The external apparatus 200 may be coupled with a system clock pad 302 of the first semiconductor apparatus 300 through the system clock bus 220. The external apparatus 200 may be coupled with a system clock pad 402 of the second semiconductor apparatus 400 through the system clock bus 220. The second clock signal HCK may be a system clock signal, and may have a frequency lower than the first clock signal WCK. For example, the frequency of the second clock signal HCK may be ½ or ¼ of the frequency of the first clock signal WCK. The system clock bus 220 may be one, and may be coupled in common with the first and second semiconductor apparatuses 300 and 400. In an embodiment, two system clock buses may be provided, and may couple the first and second semiconductor apparatuses 300 and 400 with the external apparatus 200 independently of each other. The first error detection bus 251 may transmit an error detection signal ERR generated from the first semiconductor apparatus 300, to the external apparatus 200. The second error detection bus 252 may transmit an error detection signal ERR generated from the second semiconductor apparatus 400, to the external apparatus 200.

The first semiconductor apparatus 300 may receive the first clock signal WCK and the reference data RFD from the external apparatus 200. The first semiconductor apparatus 300 may generate a first internal clock signal INCLK1 from the first clock signal WCK. The first semiconductor apparatus 300 may generate the first internal clock signal INCLK1 by dividing the first clock signal WCK. The first internal clock signal INCLK1 may include a plurality of divided clock signals which have different phases. The first semiconductor apparatus 300 may output the reference data RFD based on the first internal clock signal INCLK1. The first semiconductor apparatus 300 may generate transmission data TD from the reference data RFD based on the first internal clock signal INCLK1, and may output the transmission data TD to the first data bus 231.

The second semiconductor apparatus 400 may receive the first clock signal WCK and the reference data RFD from the external apparatus 200. The second semiconductor apparatus 400 may generate a second internal clock signal INCLK2 from the first clock signal WCK. The second semiconductor apparatus 400 may generate the second internal clock signal INCLK2 by dividing the first clock signal WCK. The second internal clock signal INCLK2 may include a plurality of divided clock signals which have different phases. Although the second internal clock signal INCLK2 is described differently only in terms of the designation thereof for the sake of convenience in explanation, it is to be noted that the second internal clock signal INCLK2 may have substantially the same characteristics as the first internal clock signal INCLK1. The second semiconductor apparatus 400 may receive the transmission data TD based on the second internal clock signal INCLK2. The second semiconductor apparatus 400 may receive the transmission data TD through a shared bus 233 which couples the first data bus 231 and the second data bus 232. The second semiconductor apparatus 400 may generate reception data RD from the transmission data TD based on the second internal clock signal INCLK2. The second semiconductor apparatus 400 may generate the error detection signal ERR by comparing the reception data RD and the reference data RFD. The second semiconductor apparatus 400 may transmit the error detection signal ERR to the external apparatus 200 through the second error detection bus 252.

The first and second semiconductor apparatuses 300 and 400 may have the same configuration. Therefore, the first and second semiconductor apparatuses 300 and 400 may operate oppositely to be symmetrical with the above-described operation. The second semiconductor apparatus 400 may generate transmission data TD from the reference data RFD based on the second internal clock signal INCLK2. The first semiconductor apparatus 300 may generate reception data RD from the transmission data TD based on the first internal clock signal INCLK1. The first semiconductor apparatus 300 may generate the error detection signal ERR by comparing the reception data RD and the reference data RFD. The first semiconductor apparatus 300 may transmit the error detection signal ERR to the external apparatus 200 through the first error detection bus 251. Hereinbelow, the operation in which the second semiconductor apparatus 400 generates the error detection signal ERR will be described representatively.

In FIG. 2, the first semiconductor apparatus 300 may include a clock generation circuit 310 and a data output circuit 321. The clock generation circuit 310 may be coupled with the first data clock bus 211 through a first clock pad 301, and may receive the first clock signal WCK through the first data clock bus 211. The clock generation circuit 310 may divide the frequency of the first clock signal WCK, and generate the first internal clock signal INCLK1. For example, the clock generation circuit 310 may divide the frequency of the first clock signal WCK by 2, and generate the first internal clock signal INCLK1 which has a frequency lower than the first clock signal WCK. The clock generation circuit 310 may generate the first internal clock signal INCLK1 which includes eight divided clock signals having different phases. The eight divided clock signals may have a phase difference of 45 degrees. Therefore, the first internal clock signal INCLK1 allows a data input/output operation to be performed with a target frequency corresponding to four times the frequency of the first clock signal WCK. However, it is to be noted that the number of the divided clock signals included in the first internal clock signal INCLK1 and the difference between the frequency of the first internal clock signal INCLK1 and a target frequency are not specifically limited. The first semiconductor apparatus 300 may further include a clock buffer 311 which buffers the first clock signal WCK and provides the buffered first clock signal to the clock generation circuit 310.

The data output circuit 321 may output the reference data RFD as the transmission data TD based on the first internal clock signal INCLK1. The data output circuit 321 may output the reference data RFD as the transmission data TD in synchronization with the first internal clock signal INCLK1. For example, when the first internal clock signal INCLK1 includes eight divided clock signals which have different phases, the reference data RFD may be outputted as the transmission data TD at the rising edge or falling edge of each of the eight divided clock signals. The data output circuit 321 may be a serializer which outputs the reference data RFD as the transmission data TD in synchronization with the first internal clock signal INCLK1. The data output circuit 321 may output the transmission data TD to the first data bus 231 and the shared bus 233 through a first data pad 303. The first semiconductor apparatus 300 may further include a data output buffer 323 which buffers the transmission data TD.

The second semiconductor apparatus 400 may include a clock generation circuit 410, a data receiving circuit 422 and an error detection circuit 430. The clock generation circuit 410 may have substantially the same configuration as the clock generation circuit 310. The clock generation circuit 410 may be coupled with the second data clock bus 212 through a second clock pad 401, and may receive the first clock signal WCK through the second data clock bus 212. The clock generation circuit 410 may divide the frequency of the first clock signal WCK and generate the second internal clock signal INCLK2. Similarly to the first internal clock signal INCLK1, the second internal clock signal INCLK2 may include eight divided clock signals which have different phases. The second semiconductor apparatus 400 may further include a clock buffer 411 which buffers the first clock signal WCK and provides the buffered first clock signal to the clock generation circuit 410.

The data receiving circuit 422 may receive the transmission data TD from the first semiconductor apparatus 300. The data receiving circuit 422 may be coupled with the second data bus 232 through a second data pad 403. The data receiving circuit 422 may receive the transmission data TD outputted to the first data bus 231 from the first semiconductor apparatus 300, through the shared bus 233 and the second data bus 232. The data receiving circuit 422 may receive the transmission data TD based on the second internal clock signal INCLK2. The data receiving circuit 422 may generate reception data RD from the transmission data TD based on the second internal clock signal INCLK2. When the second internal clock signal INCLK2 includes divided clock signals which have different phases, the data receiving circuit 422 may output the reception data RD by sampling the transmission data TD at the rising edge or falling edge of each of the eight divided clock signals. The data receiving circuit 422 may be a deserializer which outputs the transmission data TD as the reception data RD in synchronization with the second internal clock signal INCLK2. The second semiconductor apparatus 400 may delay and/or gate the second internal clock signal INCLK2, and may output the transmission data TD as the reception data RD in synchronization with the delayed and/or gated second internal clock signal. A component which delays and/or gates the second internal clock signal INCLK2 will be described later. The second semiconductor apparatus 400 may further include a data input buffer 424 which buffers the transmission data TD and provides the buffered transmission data to the data receiving circuit 422.

The error detection circuit 430 may receive the reception data RD outputted from the data receiving circuit 422 and the reference data RFD. The error detection circuit 430 may compare the reception data RD and the reference data RFD and generate the error detection signal ERR. For example, the error detection circuit 430 may compare the respective bits of the reception data RD and the respective bits of the reference data RFD, and may enable the error detection signal ERR when the data of corresponding bits are different from each other. The error detection circuit 430 may be coupled with the second error detection bus 252 through a second error detection pad 405. The error detection circuit 430 may transmit the error detection signal ERR to the external apparatus 200 through the second error detection bus 252.

Still referring to FIG. 2, the first semiconductor apparatus 300 may further include a data receiving circuit 322 and an error detection circuit 330. The data receiving circuit 322 may receive transmission data TD generated from the second semiconductor apparatus 400, through the first data bus 231 and the first data pad 303. The data receiving circuit 322 may receive the first internal clock signal INCLK1. The data receiving circuit 322 may output the transmission data TD generated from the second semiconductor apparatus 400, as reception data RD, based on the first internal clock signal INCLK1. The data receiving circuit 322 may have substantially the same configuration as the data receiving circuit 422 of the second semiconductor apparatus 400. The first semiconductor apparatus 300 may further include a data input buffer 324 which buffers the transmission data TD generated from the second semiconductor apparatus 400 and provides the buffered transmission data to the data receiving circuit 322. The error detection circuit 330 may compare the reference data RFD and the reception data RD generated through the data receiving circuit 322 and generate the error detection signal ERR. The error detection signal ERR may be outputted to the first error detection bus 251 through a first error detection pad 305. The error detection signal ERR may be transmitted to the external apparatus 200 through the first error detection bus 251.

The second semiconductor apparatus 400 may further include a data output circuit 421. The data output circuit 421 may output data to the second data bus 232 through the second data pad 403. The data output circuit 421 may receive the reference data RFD and the second internal clock signal INCLK2. The data output circuit 421 may generate the transmission data TD from the reference data RFD based on the second internal clock signal INCLK2, and may output the transmission data TD to the second data bus 232. The data output circuit 421 may have substantially the same configuration as the data output circuit 321 of the first semiconductor apparatus 300. The second semiconductor apparatus 400 may further include a data output buffer 423 which buffers the transmission data TD.

Referring to FIG. 2, the first and second semiconductor apparatuses 300 and 400 may further include registers 340 and 440 and data storage regions 350 and 450. The register 340 of the first semiconductor apparatus 300 may be coupled with the first command address bus 241 through a command address pad 304. The register 340 may receive the command address signal CA which is transmitted through the first command address bus 241 from the external apparatus 200. The register 340 may receive the reference data RFD through the first command address bus 241, and store the received reference data RFD. The register 440 of the second semiconductor apparatus 400 may be coupled with the second command address bus 242 through a command address pad 404. The register 440 may receive the command address signal CA which is transmitted through the second command address bus 242 from the external apparatus 200. The register 440 may receive the reference data RFD through the second command address bus 242, and store the received reference data RFD.

The first and second semiconductor apparatuses 300 and 400 may be, for example, memory apparatuses, and the data storage regions 350 and 450 of the first and second semiconductor apparatuses 300 and 400 may be memory cell arrays capable of storing data. The data storage regions 350 and 450 may include a plurality of memory cells (not illustrated) in which data are stored. The data storage regions 350 and 450 may include a plurality of bit lines (not illustrated) and a plurality of word lines (not illustrated), and the plurality of memory cells may be coupled to points where the plurality of bit lines and the plurality of word lines intersect with each other. The data storage regions 350 and 450 may be coupled with the data output circuits 321 and 421 and the data receiving circuits 322 and 422, respectively.

The data storage regions 350 and 450 may provide stored data to the data output circuits 321 and 421 during a normal operation other than a test operation, and thereby, may output the stored data to the external apparatus 200. The data storage regions 350 and 450 may store data received through the data receiving circuits 322 and 422, respectively.

Figure 3:
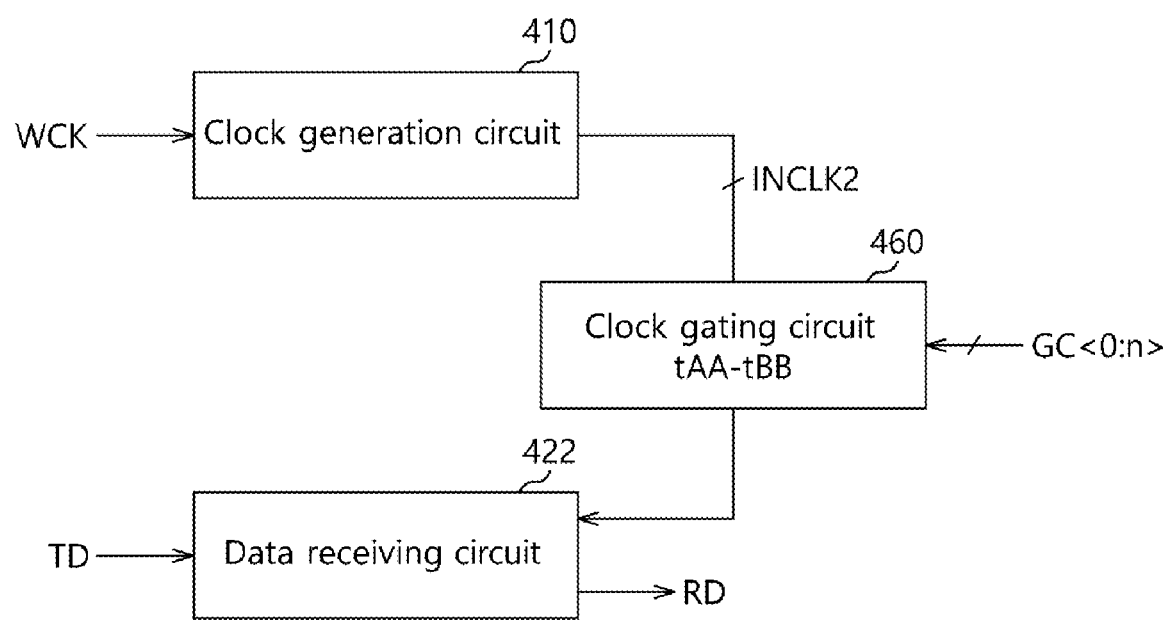
FIG. 3 is a diagram illustrating a representation of an example of the coupling relationship of a clock gating circuit in accordance with an embodiment.

The second semiconductor apparatus 400 may further include a clock gating circuit 460. Referring to FIG. 3, the clock gating circuit 460 may be coupled between the clock generation circuit 410 and the data receiving circuit 422. The clock gating circuit 460 may delay and/or gate the second internal clock signal INCLK2 generated from the clock generation circuit 410, and may provide the delayed and/or gated second internal clock signal to the data receiving circuit 422. The clock gating circuit 460 may delay the second internal clock signal INCLK2 by a preset time, and may output the delayed second internal clock signal. As will be described later, the preset time may correspond to a time that is obtained by subtracting a second time tBB from a first time tAA. The first time tAA may be a time from a time when the first clock signal WCK is inputted to the first semiconductor apparatus 300 to a time when the transmission data TD is outputted from the data output circuit 321. The second time tBB may be a time from a time when the first clock signal WCK is inputted to the second semiconductor apparatus 400 to a time when the second internal clock signal INCLK2 is generated by the clock generation circuit 410. In an embodiment, the clock gating circuit 460 may be configured by a delay circuit which has a delay amount corresponding to the preset time. In an embodiment, the clock gating circuit 460 may be configured by a gating circuit which outputs the second internal clock signal INCLK2 after a time corresponding to the preset time, based on a gating control signal GC<0:n>. The first semiconductor apparatus 300 may further include a clock gating circuit which generates the first internal clock signal INCLK1 to receive the transmission data TD generated from the data output circuit 421 of the second semiconductor apparatus 400. The clock gating circuit may be coupled between the clock generation circuit 310 and the data receiving circuit 322, similarly to the clock gating circuit 460.

Figure 4:
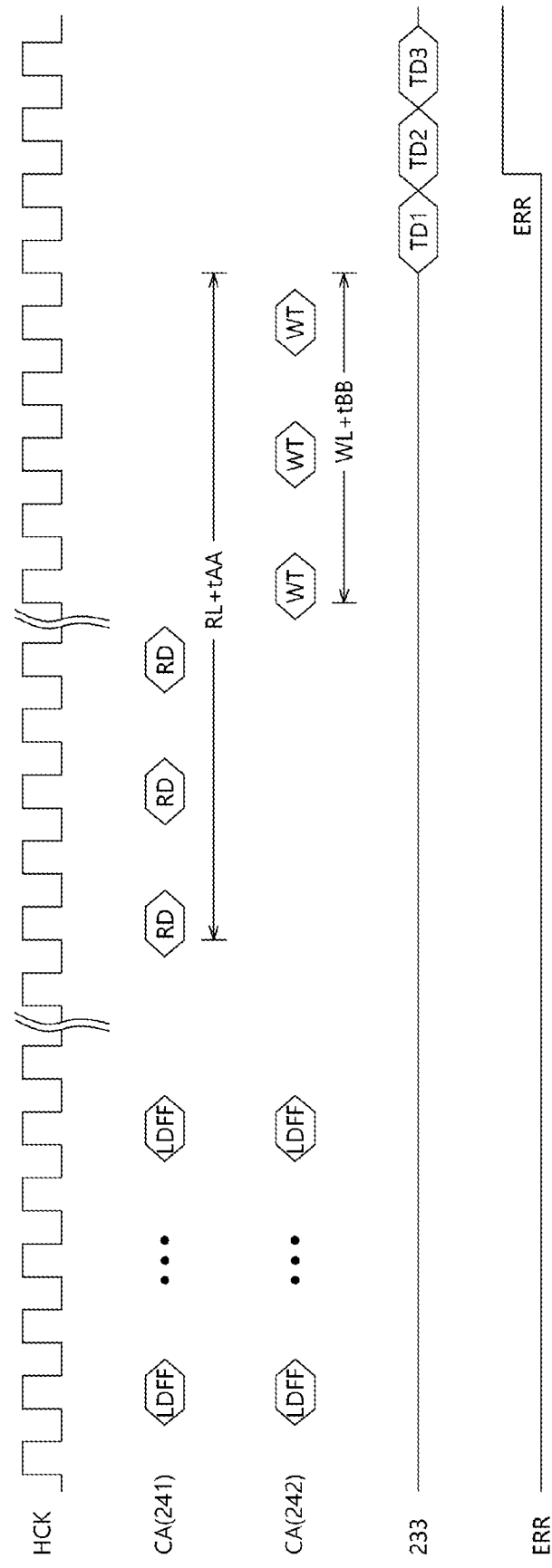
FIG. 4 is a representation of an example of a timing diagram to assist in the explanation of the operation of the system in accordance with an embodiment.
Figure 5:
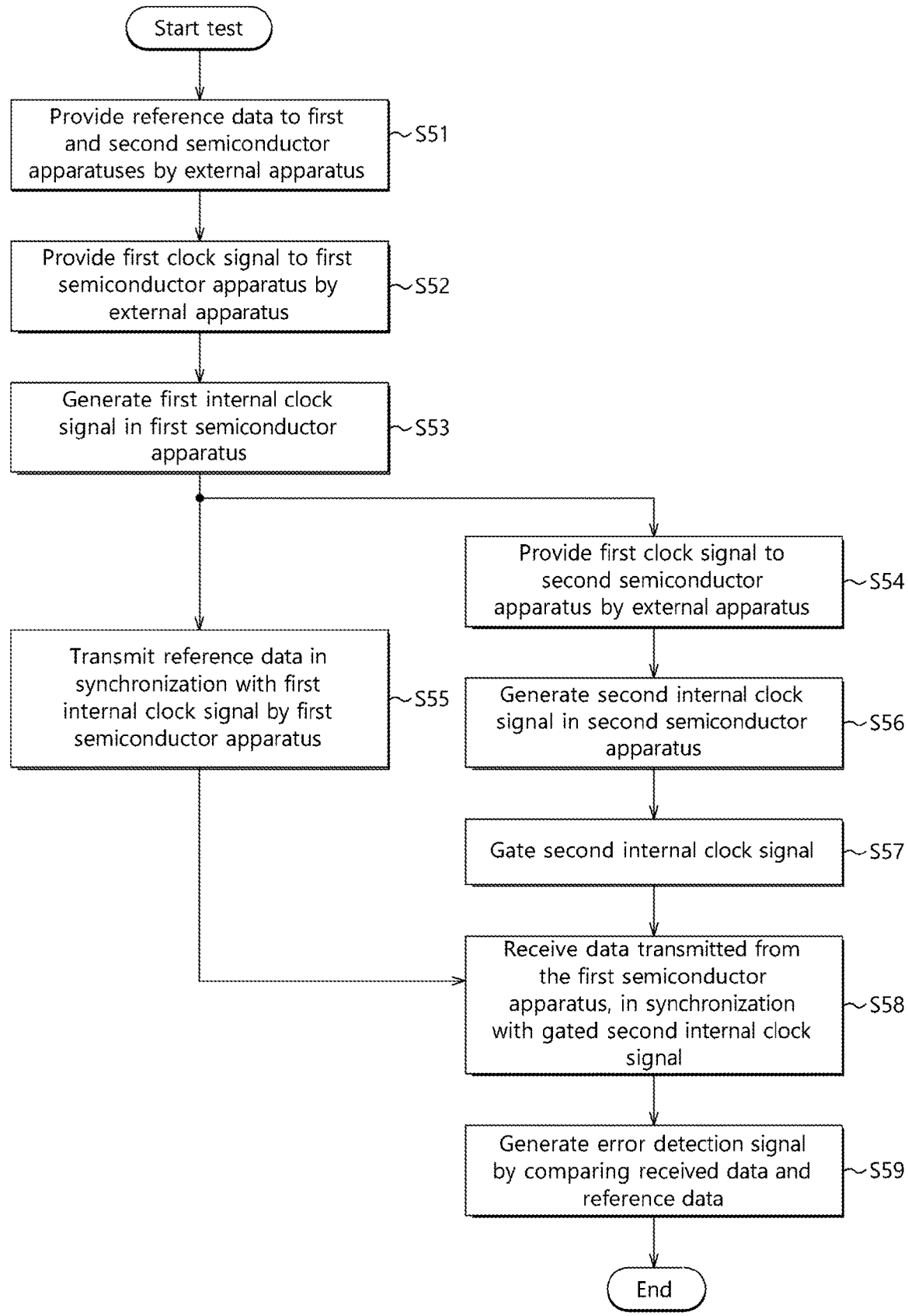
FIG. 5 is a representation of an example of a flow chart to assist in the explanation of the operation of the system in accordance with an embodiment.

FIG. 4 is a representation of an example of a timing diagram to assist in the explanation of the operation of the system 2 in accordance with an embodiment, and FIG. 5 is a representation of an example of a flow chart to assist in the explanation of the operation of the system 2 in accordance with an embodiment. The operation of the system 2 in accordance with an embodiment will be described below with reference to FIGS. 2 to 5. If a test operation is started, the external apparatus 200 may provide the reference data RFD to the first and second semiconductor apparatuses 300 and 400 (S51). The reference data RFD may be transmitted as the command address signal CA to the first and second semiconductor apparatuses 300 and 400 through the first and second command address buses 241 and 242. The external apparatus 200 may transmit a reference data command signal LDFF to the first and second semiconductor apparatuses 300 and 400 in synchronization with the second clock signal HCK. The external apparatus 200 may successively transmit a plurality of reference data command signals LDFF. The reference data command signal LDFF may include information on the reference data RFD and a command signal instructing to store the reference data RFD. The registers 340 and 440 of the first and second semiconductor apparatuses 300 and 400 may receive the reference data command signal LDFF and store the reference data RFD.

The external apparatus 200 may transmit a read command signal RD as the command address signal CA instructing a read operation, to the first semiconductor apparatus 300 through the first command address bus 241. The read command signal RD may be transmitted in synchronization with the second clock signal HCK, and a preset number of read command signals RD may be successively transmitted depending on the number of bits of the reference data RFD. In FIG. 4, it is illustrated that three read command signals RD are successively provided. The external apparatus 200 may transmit the first clock signal WCK to the first semiconductor apparatus 300 through the first data clock bus 211 at the same time as transmitting the read command signals RD (S52). At this time, data may not be transmitted through the first data bus 231. The first semiconductor apparatus 300 may generate the first internal clock signal INCLK1 from the first clock signal WCK (S53).

The external apparatus 200 may transmit a write command signal WT as the command address signal CA instructing a write operation, to the second semiconductor apparatus 400 through the second command address bus 242. The write command signal WT may be transmitted in synchronization with the second clock signal HCK, and may be successively transmitted in the same manner as the read command signal RD. The external apparatus 200 may transmit the first clock signal WCK to the second semiconductor apparatus 400 at the same time as transmitting the write command signal WT (S54).

The first semiconductor apparatus 300 may transmit the reference data RFD based on the first internal clock signal INCLK1 after a delay time corresponding to a read latency RL and the first time tAA elapses (S55). The first semiconductor apparatus 300 may output the reference data RFD as the transmission data TD in synchronization with the first internal clock signal INCLK1. The read latency RL may mean a delay time until a read operation is actually performed after a semiconductor apparatus receives a read command signal. The first semiconductor apparatus 300 may output the transmission data TD to the first data bus 231 and the shared bus 233 at a time when the read latency RL and the first time tAA have elapsed.

The second semiconductor apparatus 400 may generate the second internal clock signal INCLK2 from the first clock signal WCK (S56). The clock gating circuit 460 of the second semiconductor apparatus 400 may delay the second internal clock signal INCLK2 by the preset time tAA-tBB, and may output the delayed second internal clock signal (S57). The second semiconductor apparatus 400 may receive the data transmitted from the first semiconductor apparatus 300, based on the second internal clock signal INCLK2 which is gated by the clock gating circuit 460 (S58). The second semiconductor apparatus 400 may receive the transmission data TD as the reception data RD in synchronization with the gated second internal clock signal INCLK2 after a write latency WL and the second time tBB elapse. The write latency WL may mean a delay time until a write operation is actually performed after a semiconductor apparatus receives a write command signal. Since the clock gating circuit 460 gates the second internal clock signal INCLK2 such that the second internal clock signal INCLK2 is delayed by the preset time tAA-tBB, a time at which the transmission data TD is outputted from the first semiconductor apparatus 300 and a time at which the second semiconductor apparatus 400 receives the transmission data TD may become substantially the same.

The error detection circuit 430 of the second semiconductor apparatus 400 may generate the error detection signal ERR by comparing the reception data RD and the reference data RFD (S59). The error detection circuit 430 may perform a comparison operation for data groups which are inputted and outputted based on one read command signal and one write command signal. For example, the transmission data TD transmitted from the first semiconductor apparatus 300 may be divided into first to third groups TD1, TD2 and TD3, and, when the levels of the first data group TD1 of the transmission data TD and the first group of the reference data RFD are the same, the error detection circuit 430 may hold the disable state of the error detection signal ERR. When the level of the second group TD2 of the transmission data TD transmitted from the first semiconductor apparatus 300 and the second group of the reference data RFD are different, the error detection circuit 430 may enable the error detection signal ERR. The external apparatus 200 may receive the error detection signal ERR, and may determine whether the test operation is a pass or a failure, based on the error detection signal ERR. The first and second semiconductor apparatuses 300 and 400 may perform the test operation illustrated in FIGS. 4 and 5 by changing their roles.

The system 2 may perform a test operation for the first semiconductor apparatus 300 and the second semiconductor apparatus 400 in a low speed operation environment in which the external apparatus 200 cannot provide the first clock signal WCK having a high frequency. The first semiconductor apparatus 300 may output the transmission data TD generated based on the reference data RFD, in synchronization with the first internal clock signal INCLK1 having a high frequency, and the second semiconductor apparatus 400 may receive the transmission data TD transmitted from the first semiconductor apparatus 300, in synchronization with the second internal clock signal INCLK2 having a high frequency. Therefore, data may be transmitted at a high speed between the first and second semiconductor apparatuses 300 and 400, and it is possible to perform a test at a high speed for the first and second semiconductor apparatuses 300 and 400, even in a low speed operation environment.

Figure 6:
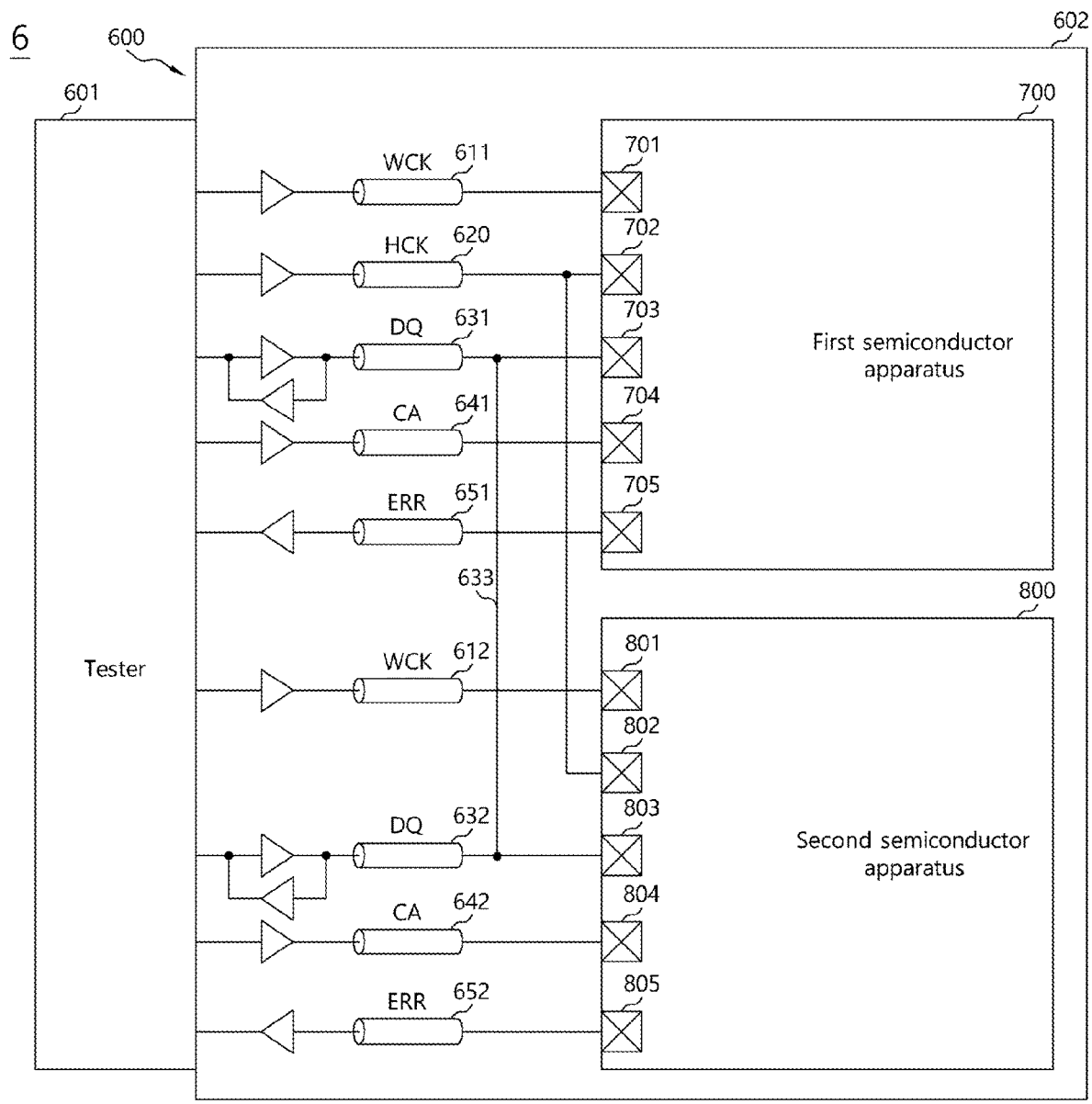
FIG. 6 is a diagram illustrating a representation of an example of the configuration of a system in accordance with an embodiment.

FIG. 6 is a diagram illustrating a representation of an example of the configuration of a system 6 in accordance with an embodiment. Referring to FIG. 6, the system 6 may include a test apparatus 600, a first semiconductor apparatus 700 and a second semiconductor apparatus 800. The system 6 may be an implementation example of the system 2 illustrated in FIG. 2. The test apparatus 600 may be test equipment for testing the first and second semiconductor apparatuses 700 and 800. The test apparatus 600 may include a tester 601 and a test board 602. The tester 601 may generate all control signals necessary to test the first and second semiconductor apparatuses 700 and 800, and provide the control signals to the first and second semiconductor apparatuses 700 and 800. The control signals may include a first clock signal WCK, a second clock signal HCK, data DQ and a command address signal CA. The tester 601 may monitor a result of a test operation by receiving error detection signals outputted from the first and second semiconductor apparatuses 700 and 800.

The test board 602 may include slots in which the first and second semiconductor apparatuses 700 and 800 may be mounted. The test board 602 may include various wiring lines. The test board 602 may include a first clock transmission line 611, a system clock transmission line 620, a first data transmission line 631, a first command address signal transmission line 641 and a first error detection signal transmission line 651. The tester 601 may be coupled with a first clock pad 701 of the first semiconductor apparatus 700 through the first clock transmission line 611, and may provide the first clock signal WCK to the first semiconductor apparatus 700 through the first clock transmission line 611. The tester 601 may be coupled with a system clock pad 702 of the first semiconductor apparatus 700 through the system clock transmission line 620, and may provide the second clock signal HCK to the first semiconductor apparatus 700 through the system clock transmission line 620. The tester 601 may be coupled with a first data pad 703 of the first semiconductor apparatus 700 through the first data transmission line 631, and may transmit and receive data DQ to and from the first semiconductor apparatus 700 through the first data transmission line 631. The tester 601 may be coupled with a command address pad 704 of the first semiconductor apparatus 700 through the first command address signal transmission line 641, and may provide the command address signal CA to the first semiconductor apparatus 700 through the first command address signal transmission line 641. The tester 601 may be coupled with a first error detection pad 705 of the first semiconductor apparatus 700 through the first error detection signal transmission line 651, and may receive the error detection signal ERR outputted from the first semiconductor apparatus 700, through the first error detection signal transmission line 651.

The test board 602 may further include a second clock transmission line 612, a second data transmission line 632, a second command address signal transmission line 642 and a second error detection signal transmission line 652. The tester 601 may be coupled with a second clock pad 801 of the second semiconductor apparatus 800 through the second clock transmission line 612, and may provide the first clock signal WCK to the second semiconductor apparatus 800 through the second clock transmission line 612. The tester 601 may be coupled with a system clock pad 802 of the second semiconductor apparatus 800 through the system clock transmission line 620, and may provide the second clock signal HCK to the second semiconductor apparatus 800 through the system clock transmission line 620. The tester 601 may be coupled with a second data pad 803 of the second semiconductor apparatus 800 through the second data transmission line 632, and may transmit and receive data DQ to and from the second semiconductor apparatus 800 through the second data transmission line 632. The tester 601 may be coupled with a command address pad 804 of the second semiconductor apparatus 800 through the second command address signal transmission line 642, and may provide the command address signal CA to the second semiconductor apparatus 800 through the second command address signal transmission line 642. The tester 601 may be coupled with a second error detection pad 805 of the second semiconductor apparatus 800 through the second error detection signal transmission line 652, and may receive the error detection signal ERR outputted from the second semiconductor apparatus 800, through the second error detection signal transmission line 652. The test board 602 may further include a plurality of buffers for buffering the signals transmitted through the plurality of signal transmission lines, respectively.

On the test board 602, the system clock transmission line 620 may be coupled in common to the first and second semiconductor apparatuses 700 and 800. As aforementioned, the tester 601 may provide the second clock signal HCK to the first and second semiconductor apparatuses 700 and 800 through one system clock transmission line 620. On the test board 602, the first data transmission line 631 and the second data transmission line 632 may be coupled with each other through a shared line 633. Therefore, the data outputted from the first semiconductor apparatus 700 may be transmitted to the second semiconductor apparatus 800, and the data outputted from the second semiconductor apparatus 800 may be transmitted to the first semiconductor apparatus 700. During a test operation in accordance with an embodiment, the tester 601 may not provide data DQ to the first and second semiconductor apparatuses 700 and 800 through the first and second data transmission lines 631 and 632.

While various embodiments have been described above, it will be understood to those skilled in the art that the embodiments described are examples only. Accordingly, the semiconductor apparatuses and systems related to performing high speed test in low speed operation environment described herein should not be limited based on the described embodiments.

What is claimed is:

1. A system comprising:
a first semiconductor apparatus and a second semiconductor apparatus,
wherein the first semiconductor apparatus outputs reference data as transmission data based on a first internal clock signal generated from a first clock signal,
wherein the second semiconductor apparatus generates reception data by receiving the transmission data based on a second internal clock signal generated from the first clock signal, and generates an error detection signal based on the reception data and the reference data, and
wherein the first internal clock signal is generated by dividing the first clock signal to allow the reference data to be output as the transmission data with the use of a target frequency corresponding to a frequency which is greater than the first clock signal.

2. The system according to claim 1,
wherein the second internal clock signal is generated by dividing the first clock signal.

3. The system according to claim 1,
wherein the second internal clock signal is generated by dividing the first clock signal to allow the transmission data to be received and generate the reception data with the use of the target frequency corresponding to the frequency which is greater than the first clock signal.

4. The system according to claim 1, wherein the second semiconductor apparatus generates an error detection signal by comparing the reception data and the reference data.

5. The system according to claim 1, wherein the first semiconductor apparatus comprises:
a first clock generation circuit configured to divide the first clock signal and generate the first internal clock signal; and
a data output circuit configured to output the reference data as the transmission data in synchronization with the first internal clock signal.

6. The system according to claim 1, wherein the second semiconductor apparatus comprises:
a second clock generation circuit configured to divide the first clock signal and generate the second internal clock signal;
a data receiving circuit configured to generate the reception data from the transmission data based on the second internal clock signal; and
an error detection circuit configured to generate the error detection signal by comparing the reference data and the reception data.

7. The system according to claim 1,
wherein a data bus of the first semiconductor apparatus and a data bus of the second semiconductor apparatus are coupled, and
wherein the second semiconductor apparatus receives the transmission data through the data bus of the first semiconductor apparatus and the data bus of the second semiconductor apparatus.

8. The system according to claim 1,
wherein the first and second semiconductor apparatuses comprise command address buses, respectively, and
wherein the first and second semiconductor apparatuses further comprise registers, respectively, which store the reference data based on a command address signal which is transmitted through the command address buses.

9. A system comprising:
an external apparatus configured to provide a first clock signal and reference data;
a first semiconductor apparatus configured to generate a first internal clock signal from the first clock signal, and output the reference data as transmission data based on the first internal clock signal; and
a second semiconductor apparatus configured to generate a second internal clock signal from the first clock signal, generate reception data by receiving the transmission data based on the second internal clock signal, and configured to generate an error detection signal based on the reference data and the reception data,
wherein the first internal clock signal is generated by dividing the first clock signal to allow the reference data to be output as the transmission data with the use of a target frequency corresponding to a frequency which is greater than the first clock signal.

10. The system according to claim 9,
wherein the second internal clock signal is generated by dividing the first clock signal.

11. The system according to claim 9, wherein the second semiconductor apparatus generates an error detection signal by comparing the reception data and the reference data.

12. The system according to claim 9,
wherein the second internal clock signal is generated by dividing the first clock signal to allow the transmission data to be received and generate the reception data with the use of the target frequency corresponding to the frequency which is greater than the first clock signal.

13. The system according to claim 9, wherein the external apparatus comprises command address buses which are coupled with the first and second semiconductor apparatuses, respectively, and provides the reference data through the command address buses.

14. The system according to claim 9,
wherein the first semiconductor apparatus comprises:
a first clock generation circuit configured to divide the first clock signal and generate the first internal clock signal; and
a data output circuit configured to output the reference data as the transmission data in synchronization with the first internal clock signal, and
wherein the first semiconductor apparatus outputs the transmission data to a first data bus through a first data pad.

15. The system according to claim 14, wherein the second semiconductor apparatus comprises:
a second clock generation circuit configured to divide the first clock signal and generate the second internal clock signal;
a data receiving circuit configured to generate the reception data by receiving the transmission data based on the second internal clock signal; and
an error detection circuit configured to generate the error detection signal by comparing the reference data and the reception data.

16. The system according to claim 15, wherein the second semiconductor apparatus is coupled with a second data bus through a second data pad, the second data bus is coupled with the first data bus, and the second semiconductor apparatus receives the transmission data through the first and second data buses.

17. The system according to claim 9, wherein the second semiconductor apparatus is coupled with an error detection bus through an error detection pad, and transmits the error detection signal to the external apparatus through the error detection bus.

18. A method for testing a system including an external apparatus, a first semiconductor apparatus, and a second semiconductor apparatus, the method comprising:
providing reference data to each of the first and second semiconductor apparatuses from the external apparatus;
providing a first clock signal to the first semiconductor apparatus from the external apparatus, and generating a first internal clock signal from the first clock signal in the first semiconductor apparatus;
providing the first clock signal to the second semiconductor apparatus from the external apparatus, and generating a second internal clock signal from the first clock signal in the second semiconductor apparatus;
outputting the reference data as transmission data to a shared bus based on the first internal clock signal in the first semiconductor apparatus;
receiving the transmission data transmitted through the shared bus, based on the second internal clock signal in the second semiconductor apparatus; and
generating an error detection signal based on the received transmission data and the reference data in the second semiconductor apparatus,
wherein the first internal clock signal is generated by dividing the first clock signal to allow the reference data to be output as the transmission data with the use of a target frequency corresponding to a frequency which is greater than the first clock signal.

19. The method according to claim 18, further comprising, after the providing, storing the reference data in the first and second semiconductor apparatuses.

20. The method according to claim 18,
wherein the second internal clock signal is generated by dividing the first clock signal in the second semiconductor apparatus.

21. The method according to claim 18,
wherein the error detection signal is generated by comparing the received transmission data and the reference data in the second semiconductor apparatus.

22. A system comprising:
a first semiconductor apparatus and a second semiconductor apparatus,
wherein the first semiconductor apparatus outputs reference data as transmission data based on a first internal clock signal generated from a first clock signal,
wherein the second semiconductor apparatus generates reception data by receiving the transmission data based on a second internal clock signal generated from the first clock signal, and generates an error detection signal based on the reception data and the reference data, and wherein the first and second semiconductor apparatuses receive the reference data based on a second clock signal, the second clock signal having a frequency lower than the first clock signal.

23. A system comprising:

a first semiconductor apparatus and a second semiconductor apparatus, wherein the first semiconductor apparatus outputs reference data as transmission data based on a first internal clock signal generated from a first clock signal, wherein the second semiconductor apparatus generates reception data by receiving the transmission data based on a second internal clock signal generated from the first clock signal, and generates an error detection signal based on the reception data and the reference data, and wherein the second semiconductor apparatus further comprises:

a clock gating circuit configured to delay the second internal clock signal and provide the delayed second internal clock signal to the data receiving circuit, and wherein a delay amount of the clock gating circuit corresponds to a time that is obtained by subtracting a time from a time at which the first clock signal is inputted to the second semiconductor apparatus to a time at which the second semiconductor apparatus generates the second internal clock signal, from a time from a time at which the first clock signal is inputted to the first semiconductor apparatus to a time at which the transmission data is outputted from the first semiconductor apparatus.

24. A system comprising:

an external apparatus configured to provide a first clock signal and reference data;

a first semiconductor apparatus configured to generate a first internal clock signal from the first clock signal, and output the reference data as transmission data based on the first internal clock signal; and a second semiconductor apparatus configured to generate a second internal clock signal from the first clock signal, generate reception data by receiving the transmission data based on the second internal clock signal, and configured to generate an error detection signal based on the reference data and the reception data, wherein the external apparatus provides the reference data based on a second clock signal, and the second clock signal has a frequency lower than the first clock signal.

25. A system comprising:

an external apparatus configured to provide a first clock signal and reference data;

a first semiconductor apparatus configured to generate a first internal clock signal from the first clock signal, and output the reference data as transmission data based on the first internal clock signal; and a second semiconductor apparatus configured to generate a second internal clock signal from the first clock signal, generate reception data by receiving the transmission data based on the second internal clock signal, and configured to generate an error detection signal based on the reference data and the reception data, wherein the first semiconductor apparatus comprises:

a first clock generation circuit configured to divide the first clock signal and generate the first internal clock signal; and a data output circuit configured to output the reference data as the transmission data in synchronization with the first internal clock signal, wherein the first semiconductor apparatus outputs the transmission data to a first data bus through a first data pad, wherein the second semiconductor apparatus comprises:

a second clock generation circuit configured to divide the first clock signal and generate the second internal clock signal;

a data receiving circuit configured to generate the reception data by receiving the transmission data based on the second internal clock signal; and an error detection circuit configured to generate the error detection signal by comparing the reference data and the reception data, wherein the second semiconductor apparatus further comprises:

a clock gating circuit configured to delay the second internal clock signal and provide the delayed second internal clock signal to the data receiving circuit, and wherein a delay amount of the clock gating circuit corresponds to a time that is obtained by subtracting a time from a time at which the first clock signal is inputted to the second semiconductor apparatus to a time at which the second semiconductor apparatus generates the second internal clock signal, from a time from a time at which the first clock signal is inputted to the first semiconductor apparatus to a time at which the transmission data is outputted from the first semiconductor apparatus.

26. A method for testing a system including an external apparatus, a first semiconductor apparatus, and a second semiconductor apparatus, the method comprising:

providing reference data to each of the first and second semiconductor apparatuses from the external apparatus;

providing a first clock signal to the first semiconductor apparatus from the external apparatus, and generating a first internal clock signal from the first clock signal in the first semiconductor apparatus;

providing the first clock signal to the second semiconductor apparatus from the external apparatus, and generating a second internal clock signal from the first clock signal in the second semiconductor apparatus;

outputting the reference data to a shared bus based on the first internal clock signal in the first semiconductor apparatus;

receiving the data transmitted through the shared bus, based on the second internal clock signal in the second semiconductor apparatus; and generating an error detection signal based on the received data and the reference data in the second semiconductor apparatus, wherein the external apparatus provides the reference data based on a second clock signal, and wherein the second clock signal has a frequency lower than the first clock signal.

27. A method for testing a system including an external apparatus, a first semiconductor apparatus, and a second semiconductor apparatus, the method comprising:

providing reference data to each of the first and second semiconductor apparatuses from the external apparatus;

providing a first clock signal to the first semiconductor apparatus from the external apparatus, and generating a first internal clock signal from the first clock signal in the first semiconductor apparatus;

providing the first clock signal to the second semiconductor apparatus from the external apparatus, and generating a second internal clock signal from the first clock signal in the second semiconductor apparatus;

outputting the reference data to a shared bus based on the first internal clock signal in the first semiconductor apparatus;

receiving the data transmitted through the shared bus, based on the second internal clock signal in the second semiconductor apparatus;

generating an error detection signal based on the received data and the reference data in the second semiconductor apparatus;

gating the second internal clock signal by delaying the second internal clock signal in the second semiconductor apparatus, wherein a delay amount of the second internal clock signal corresponds to a time that is obtained by subtracting a time from a time at which the first clock signal is inputted to the second semiconductor apparatus to a time at which the second semiconductor apparatus generates the second internal clock signal, from a time from a time at which the first clock signal is inputted to the first semiconductor apparatus to a time at which the reference data is outputted from the first semiconductor apparatus.

* * * * *